United States Patent
Le Gall et al.

(10) Patent No.: US 9,426,923 B2
(45) Date of Patent: Aug. 23, 2016

(54) DEVICE WITH OPTIMIZED PLACEMENT OF CONNECTORS

(75) Inventors: Rene Le Gall, Sorede (FR); Christian Gallais, Romille (FR); Yvon Moisdon, Nouvoitou (FR)

(73) Assignee: Thomson Licensing (FR)

( * ) Notice: Subject to any disclaimer, the term of this patent is extended or adjusted under 35 U.S.C. 154(b) by 0 days.

(21) Appl. No.: 13/200,568

(22) Filed: Sep. 26, 2011

(65) Prior Publication Data

US 2012/0087101 A1  Apr. 12, 2012

(30) Foreign Application Priority Data

Sep. 28, 2010  (FR) ...................................... 10 57818

(51) Int. Cl.
*H05K 7/02* (2006.01)
*H05K 7/14* (2006.01)

(52) U.S. Cl.
CPC .................. *H05K 7/1457* (2013.01)

(58) Field of Classification Search
CPC ............ H04K 7/1457; H01R 13/44–13/4538
USPC ............... 361/725, 730, 752, 807, 809, 810; 439/246, 248, 527, 533
See application file for complete search history.

(56) References Cited

U.S. PATENT DOCUMENTS

| | | | | |
|---|---|---|---|---|
| 3,181,104 A * | 4/1965 | Oxley | ..................... | H01R 13/41 174/153 R |
| 3,611,268 A * | 10/1971 | Webb | ...................... | H04Q 1/16 361/809 |
| 3,617,985 A * | 11/1971 | Kehl | ....................... | H01R 23/10 439/341 |
| 3,966,291 A * | 6/1976 | Hug | ....................... | H01R 13/746 248/222.52 |
| 4,162,816 A * | 7/1979 | Malsot | ................... | H01R 13/64 439/246 |
| 4,271,455 A * | 6/1981 | McComas | .............. | H05K 10/00 340/815.47 |
| 4,279,466 A * | 7/1981 | Makuch | ................. | G02B 6/383 385/59 |
| 4,738,635 A * | 4/1988 | Harrington | ............ | H01R 31/02 439/452 |
| 4,744,010 A * | 5/1988 | Witte | ................... | H01R 4/2404 174/101 |
| 4,764,950 A * | 8/1988 | Dickey | ................... | H04M 1/24 361/809 |
| 4,858,067 A * | 8/1989 | Rochelle | ............. | H05K 5/0017 220/3.94 |

(Continued)

FOREIGN PATENT DOCUMENTS

| | | |
|---|---|---|
| CN | 101621170 | 1/2010 |
| EP | 2159613 | 3/2010 |

(Continued)

OTHER PUBLICATIONS

French Search Report dated Sep. 2, 2011.

*Primary Examiner* — Zachary M Pape
*Assistant Examiner* — Douglas Burtner
(74) *Attorney, Agent, or Firm* — Jack Schwartz & Associates, PLLC

(57) ABSTRACT

The present invention relates to a device including a hollow frame forming an enclosure, at least two electronic circuits placed inside the enclosure, at least first and second connectors to connect each an external cable to each of the electronic circuits, each of the first and second connectors comprising a base intended to be mounted on the frame and a plug capable of being inserted into the base, the plug being connected to the cable and the base being connected to the electronic circuit, the base of the first connector being placed in a first aperture made in an end wall of the frame. The second connector is placed behind the base of the first connector inside the enclosure, the cable connected to the plug of the second connector penetrating inside the enclosure through a second aperture made in the end wall of the frame.

12 Claims, 4 Drawing Sheets

(56) References Cited

U.S. PATENT DOCUMENTS

| | | | | |
|---|---|---|---|---|
| 4,858,076 A * | 8/1989 | Tsai | ............... | H05K 7/02 |
| | | | | 361/730 |
| 5,034,682 A * | 7/1991 | Mayo | ............... | G01D 5/3473 |
| | | | | 324/142 |
| 5,605,466 A * | 2/1997 | Devlin | ............... | H01R 13/447 |
| | | | | 439/144 |
| 5,761,033 A * | 6/1998 | Wilhelm | ............... | H05K 7/1429 |
| | | | | 361/679.33 |
| 5,918,089 A * | 6/1999 | Malinich | ............... | G03G 15/80 |
| | | | | 361/809 |
| 5,975,927 A | 11/1999 | Giles | | |
| 6,177,635 B1 * | 1/2001 | Sugiura | ............... | B60R 16/0215 |
| | | | | 174/138 G |
| 6,290,517 B1 | 9/2001 | Anderson | | |
| 6,339,531 B1 * | 1/2002 | McKain | ............... | G11B 31/006 |
| | | | | 248/638 |
| 6,416,336 B1 * | 7/2002 | Schulte | ............... | A47B 21/06 |
| | | | | 439/131 |
| 6,483,709 B1 | 11/2002 | Layton | | |
| 6,535,397 B2 * | 3/2003 | Clark | ............... | H05K 7/1452 |
| | | | | 333/260 |
| 6,741,463 B1 | 5/2004 | Akhtar et al. | | |
| 6,834,765 B1 * | 12/2004 | Leitl | ............... | H02B 1/052 |
| | | | | 211/26 |
| 7,000,314 B2 * | 2/2006 | Morris | ............... | H05K 1/116 |
| | | | | 174/117 FF |
| 7,074,080 B1 * | 7/2006 | Khemakhem | ............... | H01R 13/518 |
| | | | | 439/578 |
| 7,215,535 B2 | 5/2007 | Pereira | | |
| 7,329,148 B2 * | 2/2008 | Khemakhem | ............... | H01R 13/514 |
| | | | | 439/578 |
| 7,355,120 B2 | 4/2008 | Herring et al. | | |
| 7,378,603 B2 * | 5/2008 | Goth | ............... | H05K 7/1487 |
| | | | | 174/370 |
| 7,661,987 B2 * | 2/2010 | Adachi | ............... | H01R 9/0518 |
| | | | | 439/595 |
| 7,717,738 B2 * | 5/2010 | Mabry | ............... | H01R 25/003 |
| | | | | 439/501 |
| 7,826,232 B2 * | 11/2010 | Von Arx | ............... | H01R 13/514 |
| | | | | 361/788 |
| 7,945,135 B2 * | 5/2011 | Cooke | ............... | G02B 6/4455 |
| | | | | 385/135 |
| 8,379,403 B2 * | 2/2013 | Waite | ............... | G01R 1/06772 |
| | | | | 257/726 |
| 2004/0097138 A1 * | 5/2004 | Kha | ............... | H01R 13/447 |
| | | | | 439/668 |
| 2004/0113804 A1 * | 6/2004 | Cabrera | ............... | H05K 7/1457 |
| | | | | 340/663 |
| 2007/0155203 A1 | 7/2007 | Shabtai et al. | | |
| 2009/0086459 A1 * | 4/2009 | Bicket | ............... | H05K 5/0247 |
| | | | | 361/809 |
| 2009/0263992 A1 | 10/2009 | Dittus et al. | | |
| 2010/0054685 A1 * | 3/2010 | Cooke | ............... | G02B 6/4455 |
| | | | | 385/135 |
| 2012/0094525 A1 * | 4/2012 | Maranto | ............... | H01R 13/5829 |
| | | | | 439/460 |

FOREIGN PATENT DOCUMENTS

| | | | | |
|---|---|---|---|---|
| EP | 2159613 A2 * | 3/2010 | ............... | G02B 6/4452 |
| GB | 2295057 | 5/1996 | | |
| WO | WO97/07567 | 2/1997 | | |

* cited by examiner

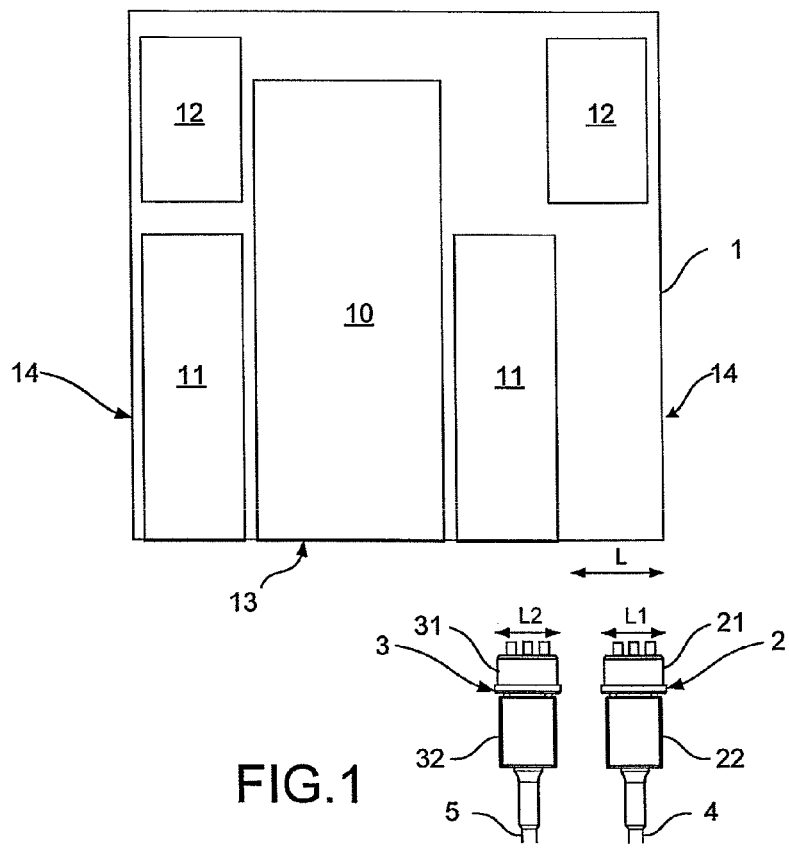
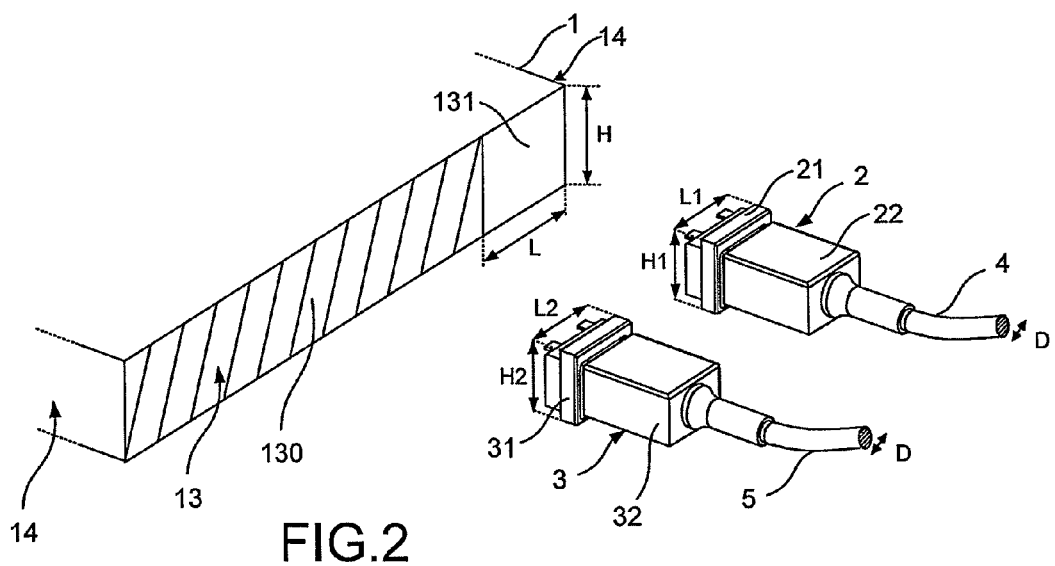

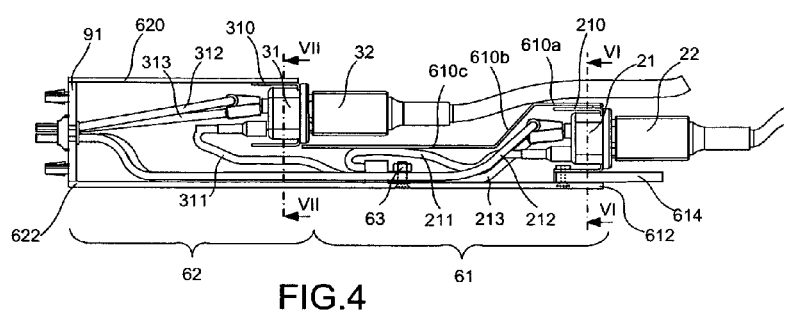 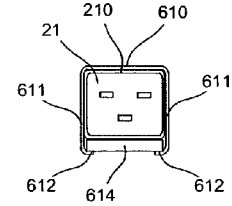
FIG.4  FIG.6
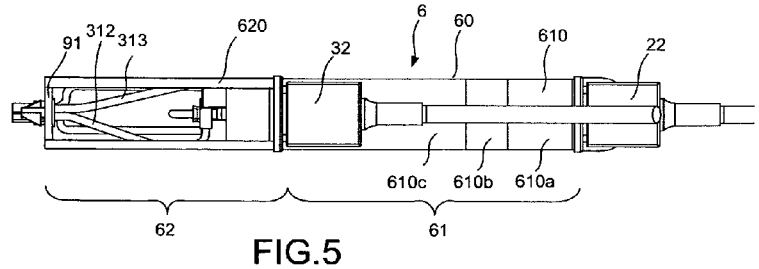 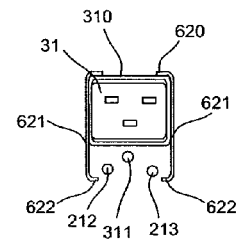
FIG.5  FIG.7

DEVICE WITH OPTIMIZED PLACEMENT OF CONNECTORS

This application claims the benefit, under 35 U.S.C. §119 of FR Patent Application 1057818, filed 28 Sep. 2010.

BACKGROUND OF THE INVENTION

The present invention relates to the placement of connectors on the frame of electronic devices.

More specifically, the present invention relates to a device comprising a hollow frame, for example of parallelepipedic general shape, forming an enclosure, at least two electronic circuits placed inside the enclosure, and at least first and second connectors to connect each an external cable to each of the electronic circuits, each of the first and second connectors comprising a base intended to be mounted on the frame and a plug capable of being inserted into the base, the plug being connected to the cable and the base being connected to the electronic circuit. The cable can be a cable intended to convey electrical signals, then called electrical cable, or a cable intended to convey optical signals, then called optical cable.

The bases of the connectors are generally fixed on an end wall of the frame, for example on the rear wall of the frame. Apertures dimensioned accordingly are made in this wall to accommodate the two bases. If the bases are of rectangular general shape and have widths L1, L2 and heights H1, H2, respectively, apertures of corresponding dimensions are made in the wall. These two apertures can be adjacent and form a single aperture.

A technical problem arises when it is not possible to make these apertures in the wall because of a lack of space, for example when the height of the wall is less than H1+H2 and when the available width of available wall for the connectors is less than L1+L2

This case is illustrated by FIGS. 1 and 2. These figures represent a frame 1 containing multiple electronic circuits, for example a motherboard 10, express PCI boards 11 and redundant power supplies 12. All the connectors of these electronic circuits are mounted on the rear wall 13 of the frame. The connectors reserved for the motherboard 10 and for the express PCI boards 11 are mounted on the hatched part 130 (FIG. 2) of the rear wall and the connectors reserved for the two redundant power supplies are to be mounted on the non-hatched area, referenced 131, of the rear wall 13. The area 131 has a height H and a width L. Two connectors 2 and 3, for example of the IEC 320 type, are to be mounted in area 131 to connect two cables 4 and 5 to the two power supplies 12. Each of the connectors 2 and 3 comprises a base, 21 and 31, respectively, and a plug, 22 and 32, respectively, intended to be inserted into the base. The bases 21 and 31 respectively have as dimensions H1×L1 and H2×L2 as indicated previously. In the illustrated case, since the two connectors are identical, of the IEC 320 type, we have L1=L2 and H1=H2. Moreover, the diameter of the cables 4 and 5 of circular cross-section is equal to D.

As indicated above, a problem arises when the area 131 is not large enough, in particular when H1+D<H<H1+H2 and L1+D<L<L1+L2. There is not then enough space to fit the connectors 2 and 3 in this area of the wall.

A solution could consist in not fixing the connectors on the rear wall of the frame and in placing them outside of the frame, their bases being connected to the redundant power supplies 12 by two cables passing through one or two aperture(s) which would be made in the area 131 of the wall. Another solution could also consist in fixing only one of the two connectors in the area 131 of the wall and in placing the other connector outside of the frame, the base of this connector being connected to one of the redundant power supplies by a cable passing through an aperture made in the area 131. However, these two solutions are not satisfactory since the presence of at least one of the connectors outside of the frame increases the risk of untimely disconnection of the latter and could impede the frame handling, in particular when the frame is to be placed in the compartment of an electrical cabinet or is to be removed from such a compartment.

BRIEF SUMMARY OF THE INVENTION

The purpose of the present invention is to propose a solution intended to compensate for all or part of the aforementioned disadvantages.

For this purpose, the present invention relates to a device comprising:

a hollow frame of parallelepipedic general shape forming an enclosure,
 at least two electronic circuits placed inside the enclosure,
 at least first and second connectors to connect each an external cable to each of the electronic circuits, each of the first and second connectors comprising a base intended to be mounted on the frame and a plug capable of being inserted into the base, the plug being connected to the cable and the base being connected to the electronic circuit, the base of the first connector being placed in a first aperture made in an end wall of the frame, According to the invention, the second connector is placed behind the base of the first connector inside the enclosure, the cable connected to the plug of the second connector penetrating inside the enclosure through a second aperture made in the side wall of the frame.

Since the first and second connectors being placed one behind the other, the surface of end wall required for the installation of the two connectors is reduced. Moreover, since the second connector is placed inside the enclosure of the frame, the risk of untimely disconnection of this connector is restricted. None of the connectors is placed outside of the frame.

According to another particular embodiment, the first and second apertures are grouped together and form a single aperture. This single aperture is then dimensioned to accommodate the base of the first connector and to allow the passage of the cable connected to the plug of the second connector.

As a variant, the first and second apertures are separated. The first aperture then has the same dimensions as the base of the first connector and the second aperture is dimensioned to allow the passage of the cable connected to the plug of the second connector.

According to one particular embodiment, the bases of the first and second connectors and the single aperture have a rectangular general shape.

To facilitate the connection and disconnection of the plug of the second connector, the bases of the first and second connectors are advantageously mounted on a support capable of a translation movement through the single aperture in a housing of the box between a retracted position in which the bases of the first and second connectors are present inside the housing and a deployed position in which the plug and the base of the first connector and at least the plug of the second connector are present outside of the housing. The displacement is made perpendicular to the end wall.

Advantageously, the support is equipped with a blocking means capable of cooperating with an additional blocking means of the housing to block the support in the housing in the retracted position. This blocking means can be a clipping means which is clipped into an additional means.

The support is also advantageously equipped with a lug protruding with respect to the base of the first connector for the translation movement of the support in the housing. When the support is in the retracted position, this lug is externally protruding with respect to the side wall.

According to one particular embodiment, the bases of the first and second connectors are vertically offset.

According to one particular embodiment, the device moreover comprises a third connector comprising a plug mounted on the support and connected to the bases of the first and second connectors and an additional plug mounted in the housing and connected to the electronic circuits, the plug being inserted into the additional plug when the support is in the retracted position.

BRIEF DESCRIPTION OF THE DRAWINGS

The invention will be better understood, and other aims, details, characteristics and advantages will appear more clearly over the course of the detailed description which follows in referring to the figures in the appendix, showing in:

FIG. 1, a diagrammatic top view of the elements of a device according to the invention, FIG. 2, a diagrammatic perspective and partial view of the device of FIG. 1, FIG. 3, a detailed partial view of the invention device illustrating the placement of the device connectors on a sliding support, the support being in the retracted position, FIG. 4, a side view of the sliding support of the device of FIG. 3, FIG. 5, a top view of the sliding support of the device of FIG. 3, FIG. 6, a cross-sectional view according to the plane VI-VI defined in FIG. 4, FIG. 7, a cross-sectional view according to the plane VII-VII defined in FIG. 4.

DETAILED DESCRIPTION

Figure 3:
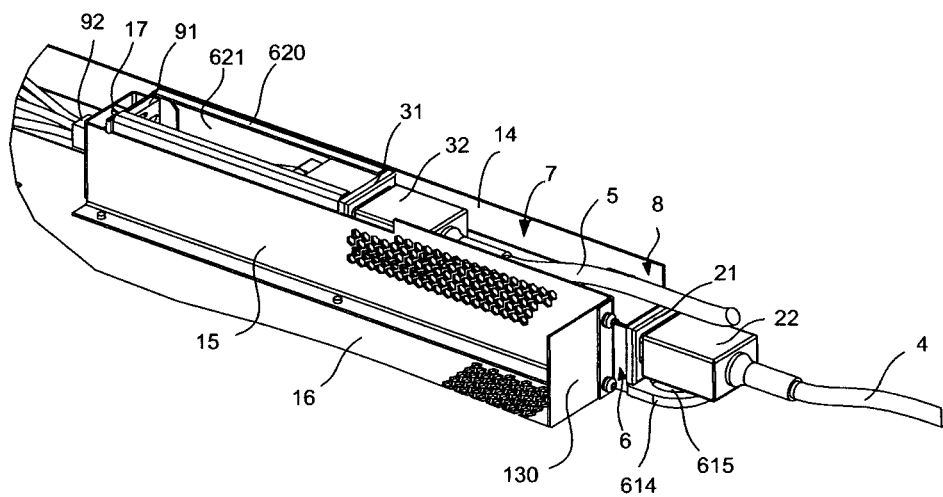
Figure 8:
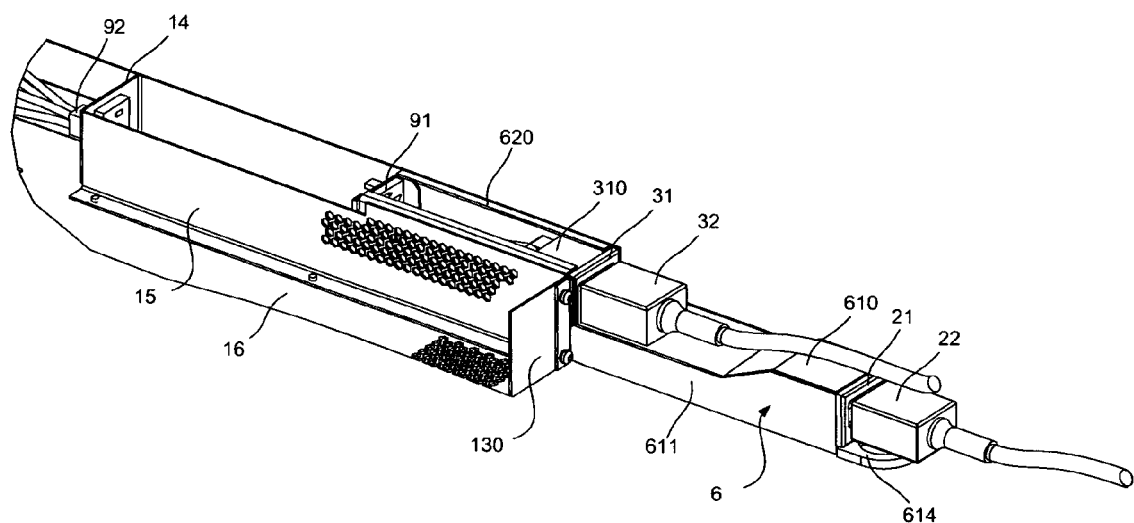
FIG. 8, a view analogous to that of figure in which the sliding support is in the deployed position.

According to the invention, the two connectors 2 and 3 are placed one behind the other. The base of one of the connectors is placed in an aperture made in the area 131 of the frame rear wall. The base and the plug of the other connector are placed inside the frame enclosure. The cable connected to the plug of this connector penetrates inside the frame enclosure through the aperture made in the area 131 or a second aperture made in this area.

Preferably, to facilitate the connection and the disconnection of the connector placed inside the frame enclosure, the two connectors 2 and 3 are mounted on a support capable of translation movement in a housing of the frame.

The present invention is illustrated by FIGS. 3 to 8.

In reference to FIGS. 3 to 8, the connectors 2 and 3 are placed one behind the other on a support 6 capable of translation movement through an aperture made in the area 131 of the rear wall 13 of the frame 1 perpendicular to the wall 13.

The support 6 moves in a housing 7 of the enclosure between a retracted position, illustrated by FIG. 3, in which the bases 21 and 31 of the connectors 2 and 3 are present inside the housing and a deployed position, illustrated by FIG. 6, in which the plug 22 and the base 21 of the connector 2 and at least the plug 32 of the connector 3 are present outside of the housing 7.

The housing 7 is delimited by a side wall 14 of the frame perpendicular to the rear wall 13 and a wall 15, parallel to the side wall 14, fixed at the bottom 16 of the frame. The distance between the walls 14 and 15 is approximately equal to the width L (of FIG. 1). At the rear wall level, the area located between the walls 14 and 15 then corresponds to the area 131. An aperture 8 is made in the rear wall 13 over the entirety of the area 131 for the passage of the support 6 and of the cable 5.

The aperture 8 has a width L slightly greater than L1 and a height H such that H1+D<H<H1+H2. This height is the frame height. The support width is equal to the width of the bases 21 and 31, i.e. L1=L2, and a height not exceeding the height H.

The support 6 comprises a load-bearing structure 60 on which are mounted, ones behind the others, the bases 21 and 31. The base 31 is placed at a distance of the base 21 allowing the plug 32 in the base 31. A male plug with 4 contacts, referenced 91, is also mounted on the load-bearing structure 60 behind the base 31. This male plug 91 is intended to be inserted with a fixed female plug, referenced 92, when the support 6 is in the retracted position. As indicated further ahead, this connector with 4 contacts made up of the male plug and female plug 92 is used to prevent the wires connecting the pins of the bases 21 and 31 to the redundant power supplies from being bent when the support is in the retracted position.

In a more detailed manner, the load-bearing structure 60 comprises, from its upstream end ending at the outside of the frame 1 to its downstream end, an upstream portion 61 supporting the base 21 of the connector 2 and a downstream portion 62 supporting the base 31 of the connector 3 and the male plug 91.

The upstream portion 61, of reversed U-shaped cross section, comprises an upper wall 610, two vertical side walls 611 extending downwards from the upper wall, and lower lugs 612 extending inwards, parallel to the upper wall 610, from the lower ends of the side walls 611. The lugs 612 lie on the bottom 16 of the frame. As shown more particularly in FIG. 6, the base 21 is mounted, via a support frame 210 of noticeably rectangular shape, between the side walls 611 and against the lower side of the upper wall 610. The support frame 210 is fixed to the walls 610 or 611 or to the lugs 612 by appropriate attachment means (not represented) such as screws or by welding. An additional lug 614 is provided between the lower wall of the support frame 210 and the lugs 612. This lug 614 is mounted as external protrusion with respect to the base 21 and constitutes a means to move the support 6 in the housing 7 between the retracted position and the deployed position. It advantageously comprises a through hole 615 to facilitate gripping of the lug by a finger.

The downstream portion 62 comprises two side walls 621 in the continuation of the side walls 611, two upper 620 and lower 622 lugs extending inwards from the upper and lower ends of the side walls 621. The lower lugs 622 are placed in the continuation of the lower lugs 612 of the upstream portion 61. As shown more particularly in FIG. 7, the base 31 is mounted, via a support frame 310 of rectangular shape, between the side walls 621 against the lower side of the upper lugs 620. The support frame 310 is fixed to the lugs 620 or to the walls 621 by appropriate attachment means (not represented) such as screws or by welding.

The male plug 91 of the connector 9 is mounted, behind the base 31, between the side walls 621 and the upper 620 and lower 622 lugs at the level of the downstream end of the support 6.

Since the bases 21 and 31 are of the IEC 320 type, they comprise each 3 pins, a pin for the neutral, a pin for the phase and a pin for the earth. The so-called earth pin is directly connected to the support, for example to the lower lugs 612 and/or 622 via electric wires 211, 311 and appropriate means fixing them to the lugs by means of a screw and a nut 63. The phase and neutral pins of the bases 21 and 31 are connected to the pins of the male plug 91 via electric wires 212, 312, 213, 313.

As indicated previously, the male plug 91 is inserted into the female plug 92 when the support is in the retracted position. The female plug 92 is mounted on a downstream wall 17 of the housing 7. The 4 contacts of the female plug 92 are connected to the redundant power supplies 12 by other electric wires. The presence of this connector with 4 contacts made up of the plugs 91 and 92 makes it possible to prevent the electric wires connecting the bases 21 and 31 to the power supplies 12 from being bent when the support 6 moves from its deployed position to its retracted position.

As a variant, it is possible to suppress the connector made up of the plugs 91 and 92 and to directly connect the phase and neutral pins of the bases 21 and 31 to the power supplies 12.

So that the connection of the plug 32 in the base 31 is rendered possible, the base 31 is positioned more in height than the base 21 and the upper wall 610 is lowered near the downstream portion 62. More precisely, the upper wall 610 is made up of a horizontal portion 610a, followed by a portion 610b tilted downwards then of a horizontal portion 610c. The portion 610c is positioned at a height less than that of the base 31 to enable the connection of the plug 32 in the base 31.

The support 6 is advantageously equipped with means for blocking the support in the housing in the retracted position. The side wall 611 near the wall 15 of the frame is for example fitted with a boss entering a port made in the wall 15 when the support is in the retracted position.

The connection or disconnection of the connector 2 is made irrespective of the position of the support 6 in the housing 7.

The connection or disconnection of the connector 3 is made when the support 6 is in the deployed position.

The connection and disconnection of the connectors 2 and 3 is made quickly without particular tools.

Though the invention has been described in relation to a specific embodiment, it is evident that this is in no way restricted and that it comprises all technical equivalents of the means described as well as their combinations if these enter into the scope of the invention.

In particular, the cables 4 and 5 are preferentially electrical cables but can also be optical cables.

What is claimed is:

1. A device comprising:
    a hollow frame forming an enclosure delimited by end walls,
    at least a first connector comprising a base configured to be mounted on the frame and configured to receive a corresponding plug, the base of the first connector being placed in an aperture made in an area of one of the end walls of the frame,
    at least a second connector comprising a base configured to be mounted inside the frame and configured to receive a corresponding plug,
    said second connector is placed inside said enclosure aligned behind the base of the first connector along a direction of insertion of plugs into the base of the first connector;
    wherein the direction of insertion of plugs into the base of the first connector corresponds to a direction of insertion of plugs into the base of the second connector.

2. The device as claimed in claim 1, wherein the bases of the first and second connectors are mounted on a support capable of translation movement, through the aperture in a housing of the box between a retracted position in which the bases of the first and second connectors are present inside the housing and a deployed position in which the base of the first connector and the corresponding plug and at least the plug associated with the second connector are present outside of the housing.

3. The device as claimed in claim 2, wherein the support is equipped with a boss capable of cooperating with a boss of the housing to block the support in the housing in the retracted position.

4. The device as claimed in claim 2, wherein the support is equipped with an externally protruding lug with respect to the base of the first connector to move in translation the support in the housing.

5. The device as claimed in claim 2, further comprising a third connector comprising a plug mounted on the support and connected to the bases of the first and second connectors and an additional plug mounted in the housing, the plug being inserted into the additional plug when the support is in the retracted position.

6. The device as claimed in claim 1, wherein the bases of the first and second connectors are vertically offset.

7. A method of inserting plugs in a device, said method comprising:
    placing a plug associated with a first connector within a first base of the first connector, said first base being mounted on a hollow frame of a device forming an enclosure delimited by end walls, said first base being placed in an aperture made in an area of one of the end walls of the frame;
    placing a plug associated with a second connector within a second base of the second connector, said second base being mounted inside the frame and being placed inside said enclosure aligned behind the first base along a direction of insertion of the plugs of the first and second connectors, the direction of insertion of plugs into the first base corresponding to the direction of insertion of plugs into the second base.

8. The method as claimed in claim 7, wherein the bases of the first and second connectors are mounted on a support and moving the support includes translational movement, through an aperture in a housing between a first retracted position in which the bases of the first and second connectors are present inside the housing and a second deployed position in which the base of the first connector and a corresponding plug and at least a plug inserted into the base of the second connector are present outside of the housing.

9. The method as claimed in claim 8, wherein the support is equipped with a boss capable of cooperating with an additional boss of the housing and moving the support into the first retracted position blocks the support in the housing.

10. The method as claimed in in claim 8, wherein translational movement of the support between the first and second positions is performed using an externally protruding lug positioned on the support with respect to the base of the first connector.

11. The method as claimed in in claim 8, further comprising placing a plug associated with a third connector on the support and connected to the bases of the first and second connectors and an additional plug mounted in the housing, the plug being inserted into the additional plug when the support is in the retracted position.

12. The method as claimed in in claim 8, wherein the bases of the first and second connectors are vertically offset.

* * * * *